US008950653B2

(12) United States Patent
Schäfer et al.

(10) Patent No.: US 8,950,653 B2
(45) Date of Patent: Feb. 10, 2015

(54) METAL PASTE WITH CO-PRECURSORS

(75) Inventors: Michael Schäfer, Künzell (DE); Wolfgang Schmitt, Rodgau (DE); Jian Zeng, Lippstadt (DE)

(73) Assignee: Heraeus Materials Technology GmbH & Co. KG, Hanau (DE)

( * ) Notice: Subject to any disclaimer, the term of this patent is extended or adjusted under 35 U.S.C. 154(b) by 0 days.

(21) Appl. No.: 13/393,241

(22) PCT Filed: Sep. 3, 2010

(86) PCT No.: PCT/EP2010/005400
§ 371 (c)(1),
(2), (4) Date: Feb. 29, 2012

(87) PCT Pub. No.: WO2011/026624
PCT Pub. Date: Mar. 10, 2011

(65) Prior Publication Data
US 2012/0153012 A1    Jun. 21, 2012

(30) Foreign Application Priority Data
Sep. 4, 2009  (DE) .......................... 10 2009 040 078

(51) Int. Cl.
| | |
|---|---|
| B23K 35/22 | (2006.01) |
| B23K 35/26 | (2006.01) |
| B23K 35/36 | (2006.01) |
| B22F 1/00 | (2006.01) |
| B22F 3/10 | (2006.01) |
| B22F 7/04 | (2006.01) |
| B23K 35/02 | (2006.01) |
| B23K 35/28 | (2006.01) |
| B23K 35/30 | (2006.01) |
| B23K 35/34 | (2006.01) |
| H01L 23/00 | (2006.01) |

(52) U.S. Cl.
CPC ........... *B23K 35/3618* (2013.01); *B22F 1/0062* (2013.01); *B22F 3/1003* (2013.01); *B22F 7/04* (2013.01); *B23K 35/025* (2013.01); *B23K 35/286* (2013.01); *B23K 35/3006* (2013.01); *B23K 35/3013* (2013.01); *B23K 35/302* (2013.01); *B23K 35/3033* (2013.01); *B23K 35/34* (2013.01); *H01L 24/83* (2013.01); *H01L 2224/8384* (2013.01); *H01L 2924/01012* (2013.01); *H01L 2924/01013* (2013.01); *H01L 2924/01025* (2013.01); *H01L 2924/01029* (2013.01); *H01L 2924/01032* (2013.01); *H01L 2924/01047* (2013.01); *H01L 2924/01051* (2013.01); *H01L 2924/01061* (2013.01); *H01L 2924/01073* (2013.01); *H01L 2924/01079* (2013.01); *H01L 2924/01082* (2013.01); *H01L 2924/01005* (2013.01); *H01L 2924/01006* (2013.01); *H01L 2924/01019* (2013.01); *H01L 2924/01023* (2013.01); *H01L 2924/01033* (2013.01); *H01L 2924/01042* (2013.01); *H01L 2924/01044* (2013.01); *H01L 2924/0105* (2013.01); *H01L 2924/01074* (2013.01); *H01L 2924/01076* (2013.01); *H01L 2924/01078* (2013.01); *H01L 2924/0132* (2013.01); *H01L 2924/0133* (2013.01); *H01L 2924/13055* (2013.01); *H01L 2924/10253* (2013.01)
USPC .................... 228/248.1; 228/56.3; 228/179.1; 148/23; 148/24

(58) Field of Classification Search
USPC ................... 228/56.3, 179.1, 248.1; 252/512; 148/24
See application file for complete search history.

(56) References Cited

U.S. PATENT DOCUMENTS

| | | | | |
|---|---|---|---|---|
| 6,410,081 | B1 * | 6/2002 | De La Prieta et al. | 228/120 |
| 6,951,666 | B2 * | 10/2005 | Kodas et al. | 427/376.6 |
| 7,691,294 | B2 * | 4/2010 | Chung et al. | 252/500 |
| 7,766,218 | B2 * | 8/2010 | Yamakawa et al. | 228/248.1 |
| 8,513,534 | B2 * | 8/2013 | Morita et al. | 174/255 |
| 2002/0018896 | A1 * | 2/2002 | Fukunaga et al. | 428/407 |
| 2004/0245648 | A1 * | 12/2004 | Nagasawa et al. | 257/772 |
| 2005/0147917 | A1 | 7/2005 | Yamaguchi | |
| 2007/0207565 | A1 | 9/2007 | Kodas et al. | |
| 2009/0134206 | A1 * | 5/2009 | Schmitt et al. | 228/198 |
| 2009/0146117 | A1 * | 6/2009 | Suenaga et al. | 252/520.3 |
| 2010/0051319 | A1 * | 3/2010 | Schmitt et al. | 174/126.1 |
| 2011/0031001 | A1 * | 2/2011 | Ishikawa et al. | 174/257 |

FOREIGN PATENT DOCUMENTS

| | | | |
|---|---|---|---|
| DE | 102007046901 A1 | | 4/2009 |
| EP | 1950767 A1 | | 7/2008 |
| EP | 2174993 A1 | * | 4/2010 |
| JP | 10183208 A | * | 7/1998 |
| JP | 2008-072052 A | | 3/2008 |
| WO | 2005079353 A2 | | 9/2005 |

OTHER PUBLICATIONS

Int'l Search Report issued Jan. 18, 2011 in Int'l Application No. PCT/EP2010/005400.
Office Action issued Sep. 29, 2010 in DE Application No. 10 2009 040 078.8.
Office Action issued Aug. 27, 2012 in EP Application No. 10 751 577.7.

* cited by examiner

*Primary Examiner* — Devang R Patel
(74) *Attorney, Agent, or Firm* — Panitch Schwarze Belisario & Nadel LLP

(57) ABSTRACT

A sintering method allows components to be joined to each other in a stable way at a processing temperature of less than 200° C., producing stable contact points having low porosity and high electrical and thermal conductivity. The method includes (a) providing a sandwich arrangement having at least a first component, a second component, and a metal paste located between the first and second components, and (b) sintering the sandwich arrangement. The metal paste includes (A) 75-90 wt. % of at least one metal present in the form of particles having an organic compound-containing coating, (B) 0-12wt % of at least one metal precursor, (C) 6-20wt % of at least one solvent, and (D) 0.1-15 wt % of at least one sintering agent selected from (i) salts of $C_1$-$C_4$ organic acids, (ii) esters of $C_1$-$C_4$ organic acids, and (iii) carbonyl complexes.

10 Claims, No Drawings

METAL PASTE WITH CO-PRECURSORS

CROSS-REFERENCE TO RELATED APPLICATIONS

This application is a Section 371 of International Application No. PCT/EP2010/005400, filed Sep. 3, 2010, which was published in the German language on Mar. 10, 2011, under International Publication No. WO 2011/026624 A1 and the disclosure of which is incorporated herein by reference.

BACKGROUND OF THE INVENTION

The present invention relates to a metal paste and a method for joining components, in which this metal paste is used.

Joining components, such as LEDs or very thin silicon chips, which exhibit high sensitivity to pressure and temperature, represents a particular challenge in the field of power electronics.

For this reason, such components that are sensitive to pressure and temperature are often joined to each other through adhesion. The adhesive technique, however, has the disadvantage that it produces contact points between the components that exhibit only inadequate heat conduction or electrical conductivity.

To solve this problem, the components to be joined are frequently sintered. The sintering technique represents a very simple method for the stable joining of components.

Conventional sintering methods, however, require either a high processing pressure or else a high processing temperature. These conditions often result in damage to the components to be joined, so that conventional sintering methods must be ruled out for many applications.

In German published patent application DE 10 2007 046 901 A1 a sintering technique is proposed, with which it is possible to build joining layers having very good electrical-conductivity and heat-conduction properties for power electronics. In this sintering method, a metal paste is used containing a silver compound, which decomposes into elementary silver below 300° C. These metal pastes allow a reduction of the processing pressure to below 3 bar and a reduction of the processing temperature to below 250° C. This sintering technique represents a large leap in quality in joining components that are sensitive to pressure and temperature.

However, for many applications it would be desirable if the processing temperature could be lowered even further. A lower temperature would lead to smaller loading of the components to be joined and thus to a further increase in the quality of the components in the field of power electronics. In addition, if the processing temperature were lowered further, considerable amounts of energy costs could be saved.

BRIEF SUMMARY OF THE INVENTION

The present invention is therefore based on the object of providing a sintering method, which allows components to be joined to each other in a stable way, wherein the processing temperature is below 200° C. This method should produce contact points between the components to be joined, which exhibit low porosity and high electrical and thermal conductivity.

Another object of the present invention consists in providing a metal paste, which can be used in the sintering method according to the invention and which allows a lowering of the processing temperature to below 200° C. and the formation of contact points between the components to be joined, having low porosity and high electrical and thermal conductivity.

These objects are achieved by a method for joining components in which (a) a sandwich arrangement is prepared having at least (a1) a component 1, (a2) a component 2, and (a3) a metal paste located between component 1 and component 2, and (b) the sandwich arrangement is sintered, characterized in that the metal paste comprises (A) 75-90 weight percent of at least one metal present in the form of particles having a coating containing at least one organic compound, (B) 0-12 weight percent of at least one metal precursor, (C) 6-20 weight percent of at least one solvent, and (D) 0.1-15 weight percent of at least one sintering agent selected from the group comprising (i) salts of organic acids, wherein the organic acids have 1-4 carbon atoms, (ii) esters of organic acids, wherein the organic acids have 1-4 carbon atoms, and (iii) carbonyl complexes.

Furthermore, a metal paste is provided, which contains (A) 75-90 weight percent of at least one metal present in the form of particles having a coating containing at least one organic compound, (B) 0-12 weight percent of at least one metal precursor, (C) 6-20 weight percent of at least one solvent, and (D) 0.1-15 weight percent of at least one sintering agent selected from the group comprising (i) salts of organic acids, wherein the organic acids have 1-4 carbon atoms, (ii) esters of organic acids, wherein the organic acids have 1-4 carbon atoms, and (iii) carbonyl complexes.

DETAILED DESCRIPTION OF THE INVENTION

The following explanations are not intended to limit the invention, but to offer only one possible explanation for the mode of operation of the invention.

The present invention, on one hand, is based on the knowledge that it is advantageous for the sintering of components with the use of metal pastes, if the particles contained in the metal paste are coated, preferably with fatty acids. If the metal particles are not coated, then the metal particles agglomerate in the metal paste and form clumps at an early stage during the sintering process. This situation often results in inhomogeneous contact points between the components to be joined.

Surprisingly, however, it was discovered that such coated metal particles are also the reason that the sintering temperature cannot be lowered below 200° C. As long as the coating compounds are on the surface of the metal particles, on one hand, an agglomeration of the metal particles is indeed prevented. But on the other hand, the surfaces of the metal particles are not available for the sintering process, so that the metal particles cannot be sintered.

Furthermore, it was likewise surprisingly found that the surface of the metal particles under the coating layer is also at least partially oxidized. Such metal oxide layers negatively affect the diffusion processes required for the sintering and thus slow down the diffusion rate. Also for this reason, it is necessary to use high processing temperatures of far above 200° C. when sintering using these metal particles oxidized on the surface.

According to the invention, sintering agents are used that release carbon monoxide during the sintering process or produce carbon monoxide when combusted. The carbon monoxide released during the sintering is a reducing agent and as such in the position to reduce the metal oxide present on the surface of the metal particles. Removing the metal oxide ensures obstacle-free diffusion and thus accompanies an increase in the diffusion rate. In this reduction of the metal oxide, in situ reactive metal is also generated that further promotes the sintering process. Furthermore, this reactive metal can fill voids present between the metal atoms of the metal particles during the sintering process and thus lower the porosity of the contact points between the components to be joined. Therefore, extremely stable and heat conductive as well as electrically conductive contact points are generated.

For an up to now unknown reason, the sintering agents used according to the invention also appear to promote the burning off of the coating compounds containing the silver particles at temperatures less than 200° C. Thus, even at temperatures of less than 200° C., the surfaces of the metal particles are available for the sintering process.

Thus, through the use of sintering agents according to the invention, the processing temperature during sintering can be significantly reduced. Here it is surprising that despite the burning away of the coating compounds at temperatures below 200° C., the metal particles do not agglomerate, but instead homogeneous and stable contact points are produced between the components to be joined.

The effects described above appear to have the result that, when the sintering agents are used, the sintering temperature can be lowered to below 200° C., and nevertheless stable, heat-conductive, and electrically conductive contact points between the components to be joined can be generated by the sintering process.

The use of metal pastes in a sintering process for joining components is known in the field of power electronics.

According to the invention, the metal paste contains at least one metal.

In the present case, the term metal encompasses both pure metals and also metal alloys.

In the scope of the invention, the term metal refers to an element that, in the periodic table of elements, is in the same period as boron but is left of boron, is in the same period as silicon but is left of silicon, is in the same period as germanium but is left of germanium, and is in the same period as antimony but is left of antimony, as well as to all elements having a higher atomic number than 55.

According to the invention, pure metals are understood to be metals containing a metal having a purity of at least 95 weight percent, preferably at least 98 weight percent, more preferably at least 99 weight percent, and even more preferably at least 99.9 weight percent.

According to one preferred embodiment, the metal comprises copper, silver, gold, nickel, palladium, platinum, or aluminum.

According to the invention, metal alloys are understood to be metallic mixtures made of at least two components, of which at least one is a metal.

According to one preferred embodiment, according to the invention, an alloy that contains copper, aluminum, nickel, and/or precious metals is used as the metal alloy. The metal alloy preferably comprises at least one metal selected from the group comprising copper, silver, gold, nickel, palladium, platinum, and aluminum. Especially preferred metal alloys contain at least two metals selected from the group comprising copper, silver, gold, nickel, palladium, platinum, and aluminum. It can be further preferred that the percentage of metals selected from the group comprising copper, silver, gold, nickel, palladium, platinum, and aluminum in the metal alloy is at least 90 weight percent, preferably at least 95 weight percent, more preferably at least 99 weight percent, and even more preferably 100 weight percent. The alloy can comprise, for example, an alloy containing copper and silver, copper, silver and gold, copper and gold, silver and gold, silver and palladium, platinum and palladium, or nickel and palladium.

As the metal, the metal paste according to the invention can contain a pure metal, several types of pure metals, a type of metal alloy, several types of metal alloys, or mixtures thereof.

The metal is present in the metal paste in the form of particles.

The metal particles can be of varying shape. For example, the metal particles can be present in the form of flakes or a spherical (ball-shaped) form. According to one especially preferred embodiment, the metal particles have the form of flakes. This does not preclude, however, that also a minor percentage of the metal particles being used could have a different form. However, it is preferred that at least 70 weight percent, more preferably at least 80 weight percent, even more preferably at least 90 weight percent, or 100 weight percent of the particles are provided in the form of flakes.

According to the invention, the metal particles are coated.

According to the invention, a coating of particles is understood to be a firmly bonded layer on the surface of the particles.

According to the invention, the coating of the metal particles contains at least one type of coating compound.

These coating compounds comprise organic compounds.

According to the invention, the organic compounds used as coating compounds comprise carbon-containing compounds that prevent agglomeration of the metal particles.

According to one preferred embodiment, the coating compounds carry at least one functional group. The functional groups can be, in particular, carboxylic acid groups, carboxylate groups, ester groups, keto groups, aldehyde groups, amino groups, amide groups, azo groups, imide groups, cyano groups, or nitrile groups. Preferred functional groups are carboxylic acid groups and ester groups. The carboxylic acid group can be deprotonated.

The coating compounds having at least one functional group preferably comprise saturated, monounsaturated, or polyunsaturated, organic compounds.

Moreover, these coating compounds having at least one functional group could be branched or unbranched.

The coating compounds according to the invention having at least one functional group have preferably 1-50, more preferably 2-24, even more preferably 6-24, and yet even more preferably 8-20 carbon atoms.

The coating compounds can be ionic or nonionic.

Preferably, free fatty acids, fatty acid salts, or fatty acid esters are used as the coating compounds.

The free fatty acids, fatty acid salts, and fatty acid esters are preferably unbranched.

Moreover, the free fatty acids, fatty acid salts, or fatty acid esters are preferably saturated.

Preferred fatty acid salts are the salts of ammonium, monoalkyl ammonium, dialkyl ammonium, trialkyl ammonium, copper, aluminum, lithium, sodium, and potassium.

Preferred esters are alkyl ester, in particular methyl ester, ethyl ester, propyl ester, and butyl ester.

According to one preferred embodiment, the free fatty acids, fatty acid salts, or fatty acid esters comprise compounds having 8-24, more preferably 10-24, and even more preferably 12-18 carbon atoms.

Preferred coating compounds are caprylic acid (octanoic acid), capric acid (decanoic acid), lauric acid (dodecanoic acid), myristic acid (tetradecanoic acid), palmitic acid (hexadecanoic acid), margaric acid (heptadecanoic acid), stearic acid (octadecanoic acid), arachidic acid (eicosanoic acid/icosanoic acid), behenic acid (docosanoic acid), lignoceric acid (tetracosanoic acid), as well as the corresponding esters and salts.

Especially preferred coating compounds are dodecanoic acid, octadecanoic acid, copper stearate, aluminum stearate, sodium stearate, potassium stearate, sodium palmitate, and potassium palmitate.

The coating compounds used according to the invention are deposited on the surface of the metal particles by conventional methods known from the prior art.

For example, it is possible to slurry the coating compounds, in particular the previously mentioned stearates or palmitates, in solvents and to grind the slurried coating compounds in ball mills with the metal particles. After the grinding, the metal particles now coated with the coating compounds are dried and then freed from dust.

Preferably, the portion of organic compounds, especially the portion of compounds selected from the group comprising free fatty acids, fatty acid salts, and fatty acid esters, preferably having 8-24, more preferably 10-24, and even more preferably 12-18 carbon atoms, in the entire coating equals at least 60 weight percent, more preferably at least 70 weight percent, even more preferably at least 80 weight percent, even more preferably at least 90 weight percent, in particular at least 95 weight percent, at least 99 weight percent, or 100 weight percent.

Typically, the portion of coating compounds, preferably the coating compounds selected from the group comprising free fatty acids, fatty acid salts, and fatty acid esters having 8-24, more preferably 10-24, and even more preferably 12-18 carbon atoms, equals 0.01-2 weight percent, preferably 0.3-1.5 weight percent, more preferably 0.4-1.4 weight percent, and even more preferably 0.5-1.0 weight percent, based on the weight of the coated metal particles.

The degree of coating, defined as the ratio of the mass of coating compounds to the surface area of the metal particles, preferably equals 0.00005-0.03 g, more preferably 0.0001-0.02 g, and even more preferably 0.0005-0.02 g of coating compounds per square meter ($m^2$) surface area of metal particles.

The metal paste according to the invention comprises, in addition to the coated metal particles, preferably at least one metal precursor.

In the scope of the invention, a metal precursor is understood to be a compound that contains at least one metal. Preferably, it comprises a compound that decomposes at temperatures below 200° C., while releasing a metal. Accordingly, by using a metal precursor in the sintering process, a metal is formed in situ. It can be determined in a simple way whether a compound comprises a metal precursor according to this preferred embodiment. For example, a paste that contains a compound to be tested can be deposited on a substrate having a silver surface, heated to 200° C., and kept at this temperature for 20 minutes. Then, it is tested whether the compound to be tested has decomposed into a metal under these conditions. For this purpose, before the test, for example, the contents of the metal-bearing paste components can be weighed and from these results the theoretical mass of the metal can be calculated. After the test, the mass of the material deposited on the substrate is determined gravimetrically. If the mass of the material deposited on the substrate corresponds to the theoretical mass of the metal, taking into account typical measurement deviations, then the tested compound comprises a metal precursor according to this preferred embodiment.

According to one preferred embodiment, the metal precursor comprises a metal precursor that can be decomposed endothermally. According to the invention, a metal precursor that can be decomposed endothermally is understood to be a metal precursor whose thermal decomposition takes place in an endothermic process, preferably under a protective gas atmosphere. Metal should be released from the metal precursor in this thermal decomposition.

According to another preferred embodiment, the metal precursor comprises a metal that is also contained in the metal powder.

Preferably, as a metal, the metal precursor comprises at least one element selected from the group comprising copper, silver, gold, nickel, palladium, and platinum.

It can be preferred to use carbonates, lactates, formates, citrates, oxides, or fatty acid salts, preferably fatty acid salts having 6 to 24 carbon atoms, of the mentioned metals as the metal precursor.

In special embodiments, silver carbonate, silver lactate, silver formate, silver citrate, silver oxide (for example AgO or $Ag_2O$), copper lactate, copper stearate, copper oxide (for example $Cu_2O$ or CuO), or gold oxide (for example $Au_2O$ or AuO) is used as the metal precursor.

According to one especially preferred embodiment, silver carbonate, silver(I) oxide or silver(II) oxide is used as the metal precursor.

If present, the metal precursor in the metal paste preferably exists in the form of a powder that consists of particles.

The particles of the powder can have the shape of flakes or a spherical (ball-like) shape. Preferably, however, the particles of the metal precursor are provided as flakes.

The use of a metal precursor, which releases metal in situ during the sintering process, has the result that the metal formed in situ during the sintering process closes gaps between the metal particles contained in the metal paste. In this way, the porosity of a contact point between two components to be joined can be reduced.

The metal paste according to the invention further contains at least one solvent.

According to the invention, solvents are understood to be compounds that can produce a solution from other compounds using physical processes. These other compounds, however, preferably do not comprise the metal of the metal paste.

According to the invention, solvents typically used for metal pastes may be considered as solvents.

Furthermore, the metal paste according to the invention contains at least one solvent.

According to the invention, solvents are understood to be compounds that can bring other compounds to form a solution in physical ways. These other compounds, however, preferably do not comprise the metal of the metal paste.

According to the invention, solvents typically used for metal pastes may be considered as the solvent.

Preferably, organic compounds having at least one heteroatom and having 6-24 carbon atoms, more preferably 8-20 carbon atoms, are used as the solvent.

These organic compounds can be branched or unbranched. The organic compounds can also comprise cyclic compounds.

Furthermore, the organic compounds used as the solvent can be saturated, monounsaturated, or polyunsaturated compounds.

The at least one heteroatom contained in the organic compounds, which can be used as the solvent, is preferably selected from the group comprising oxygen atoms and nitrogen atoms.

The at least one heteroatom can be part of at least one functional group. As the functional groups, preferably hydroxyl groups, carboxylic acid groups, ester groups, keto groups, aldehyde groups, amino groups, amide groups, azo groups, imide groups, cyano groups, or nitrile groups can be considered.

According to one especially preferred embodiment, the solvent used comprises an alcohol.

According to one especially preferred embodiment, α-terpineol ((R)-(+)-α-terpineol, (S)-(−)-α-terpineol or racemate), β-terpineol, γ-terpineol, δ-terpineol, mixtures of the terpineols named above, N-methyl-2-pyrrolidone, ethylene glycol, dimethyl acetamide, 1-tridecanol, 2-tridecanol, 3-tridecanol, 4-tridecanol, 5-tridecanol, 6-tridecanol, isotridecanol, and mixtures of these isotridecanols, dibasic ester (preferably dimethyl ester of glutaric, adipic or succinic acid or mixtures thereof), glycerin, diethylene glycol, triethylene glycol, or mixtures hereof, are used as the solvent.

Preferably, the solvent being used is able to dissolve the sintering agent contained in the metal paste.

To allow a lowering of the sintering temperature to below 200° C., at least one sintering agent is contained in the metal paste according to the invention.

The sintering agents according to the invention ensure that the metal oxides present on the surface of the metal particles contained in the metal paste are reduced during the sintering process. For this reason, compounds that release a reducing agent in the course of the sintering process are used as sintering agents. This reducing agent preferably comprises carbon monoxide.

In the scope of the invention, the at least one sintering agent can be selected from the group comprising (i) salts of organic acids, wherein the organic acids have 1-4 carbon atoms, (ii) esters of organic acids, wherein the organic acids have 1-4 carbon atoms, and (iii) carbonyl complexes.

These compounds can be used as sintering agents, in that they release carbon monoxide during the sintering process and thus allow a reduction of the metal oxides, which are contained on the surface of the metal particles contained in the metal paste, into the corresponding metal at a temperature of less than 200° C.

According to the invention, as the sintering agents, salts of organic acids having 1-4 carbon atoms can be used.

In the scope of the invention, organic acids are organic compounds that provide at least one carboxylic acid group. They can be represented by the following formula:

   Formula (I), where R stands for an organic radical.

Accordingly, salts of organic acids are, according to the invention, compounds containing at least one anionic component having at least one unit having a carboxylic acid group in which, structurally, one proton has been split off and, as a cationic component, a cation type that differs by protons. Consequently, salts of organic compounds can be represented by the following formula:

   Formula (II), where X stands for any cationic component.

According to the invention, R stands for an organic radical having 1-3 carbon atoms.

In the scope of the invention, it can be preferred that the salt in the metal paste is not present in a disassociated form. Accordingly, in one embodiment of the present invention in which a salt of an organic acid having 1-4 carbon atoms is used as a sintering agent, preferably an aprotic solvent is used as the solvent contained in the metal paste according to the invention.

According to the invention, a salt of an organic acid having 1-4 carbon atoms is used as the sintering agent.

According to a preferred embodiment, a salt of an organic acid containing 1-3 carbon atoms is used.

The organic acid having 1-4 carbon atoms can preferably comprise a monoacid or a diacid. The organic acid can be a monoprotic acid or a polyprotic acid, in particular a diprotic acid.

In addition to the at least one carboxylic acid group, the organic acid can also have at least one other functional group. This functional group can comprise, for example, another carboxylic acid group, ester group, keto group, aldehyde group, hydroxyl group, amino group, amide group, imide group, cyano group, nitrile group, or a halogen atom, in particular a fluorine atom, chlorine atom, or bromine atom.

In addition to the double bond structurally contained in the C=O group of the at least one carboxylic acid unit, the organic acid can contain other double bonds.

Preferably, salts of an acid selected from the group comprising acetic acid, carbonic acid, formic acid, lactic acid, and oxalic acid are used as the sintering agent.

Preferably metal cations can be used as the cationic components of the salts used according to the invention.

The metal cations preferably comprise cations of metals having a high affinity to oxygen. It is assumed that these metals can bind with oxygen during the sintering process and thus shift the equilibrium state of the reaction of carbon monoxide released by the sintering agent with the metal oxides present on the surface of the metal particles into carbon dioxide and the metals on the product side.

Preferred metal cations are magnesium, aluminum, copper (I), copper(II), silver(I), silver(II), manganese(III), iron(II), iron(III), cobalt(II), and tin(II).

According to one especially preferred embodiment, the at least one salt of an organic acid having 1-4 carbon atoms used as the sintering agent is selected from the group comprising copper(II) acetate, iron(II) acetate, tin(II) acetate, iron(II) carbonate, copper(II) carbonate, magnesium formate, aluminum formate, iron(II) formate, tin(II) formate, copper(II) formate, silver(II) formate, manganese(III) formate, copper(II) lactate, silver(I) lactate, iron(II) oxalate, iron(III) oxalate, and cobalt(II) oxalate.

The invention also encompasses embodiments in which it can be excluded that the metal paste contains, as a salt of an organic acid having 1-4 carbon atoms, a carbonate, lactate, or formate of copper, silver, gold, nickel, palladium, or platinum, especially silver carbonate, silver lactate, silver formate, or copper lactate.

According to the invention, as the sintering agent, also an ester of an organic acid is used, wherein the organic acid has 1-4 carbon atoms.

The organic acid having 1-4 carbon atoms, from which the ester used according to the invention is derived, preferably comprises an organic acid having 1-4 carbon atoms, as was previously described in connection with salts of organic acids having 1-4 carbon atoms.

Consequently, the ester used according to the invention preferably comprises a monoester or a polyester, in particular, a diester.

In the scope of the invention, ester stands for a compound in which at least one hydrogen or at least one carboxylic acid unit of the organic acid having 1-4 carbon atoms is structurally substituted by an organic group.

Consequently, esters represent compounds that can be described with the above Formula (II), wherein, however, the radical X represents an organic group.

If diester is used as the ester of organic acids having 1-4 carbon atoms, then the hydrogen atoms are structurally substituted by two carboxylic acid units or the hydrogen atoms of a carboxylic acid unit of a diprotic acid are substituted by organic groups. These organic groups can be of the same or different type.

According to the invention, this at least one organic group, which structurally substitutes for at least one hydrogen atom in the at least one carboxylic acid unit of the organic acid having 1-4 carbon atoms, preferably comprises a group having 1-10, more preferably 1-7, and even more preferably 1-4 carbon atoms.

This organic group can be unbranched or branched, but is preferably unbranched.

The organic group can carry one or more heteroatoms. The heteroatoms can be, in particular, oxygen, nitrogen, and halogens, as for example fluorine, chlorine, bromine, or iodine. It can also be preferred, however, that the organic group carries no heteroatoms.

If heteroatoms are present in the organic group, then these can be part of a functional group. Examples for such functional groups are carboxylic acid groups, ester groups, keto groups, aldehyde groups, amino groups, amide groups, azo groups, imide groups, cyano groups, and nitrile groups.

The organic group can be an aliphatic or aromatic group. Preferably, the organic group comprises an aliphatic group.

According to one especially preferred embodiment, the aliphatic group is an alkyl group. This alkyl group preferably has 1-10, more preferably 1-7, and even more preferably 1-4 carbon atoms. According to this embodiment, the alkyl group is unbranched. Preferably, this alkyl group contains no heteroatoms. Especially preferred alkyl groups are methyl groups, ethyl groups, propyl groups, and butyl groups.

Consequently, the esters of organic acids used according to the invention, wherein the organic acids have 1-4 carbon atoms, are preferably selected from the group comprising methyl esters, ethyl esters, propyl esters, and butyl esters.

According to this embodiment, the esters of organic acids having 1-4 carbon atoms according to the invention comprise compounds that can be represented by Formula (II), wherein the radical X stands for an alkyl group, preferably for a methyl group, ethyl group, propyl group, or butyl group.

Especially preferred esters of organic acids having 1-4 carbon atoms are consequently methyl acetate, ethyl acetate, propyl acetate, butyl acetate, dimethyl carbonate, diethyl carbonate, dipropyl carbonate, dibutyl carbonate, methylethyl carbonate, methylpropyl carbonate, methylbutyl carbonate, ethylpropyl carbonate, ethylbutyl carbonate, methyl formate, ethyl formate, propyl formate, butyl formate, methyl lactate, ethyl lactate, propyl lactate, butyl lactate, dimethyl oxalate, diethyl oxalate, dipropyl oxalate, and dibutyl oxalate.

According to the invention, carbonyl complexes can also be used as sintering agents.

According to the invention, the term "carbonyl complexes" describes metal complexes that contain carbonyl groups, in which at least one CO molecule is coordinately bound to at least one metal atom.

In addition to the at least one CO molecule, the carbonyl complexes can also have other ligands. These other ligands can comprise elementary or molecular ligands.

The ligands can be monodentate or polydentate.

Preferred elementary ligands are hydrogen and halogens. As halogens, fluorine, chlorine, bromine, and iodine are preferred.

Preferred molecular ligands are nitrogen oxides, cyanides, and organic ligands.

The organic ligands preferably comprise ionic or unsaturated ligands.

As organic ligands, organic ligands having at least one carbon atom may be considered. Preferably, the organic ligands having at least one carbon atom comprise organic ligands having 2-20, more preferably 2-16, and even more preferably 2-12 carbon atoms.

The organic ligands can be branched or unbranched.

Furthermore, the organic ligands can be saturated or monounsaturated or polyunsaturated.

Furthermore, the organic ligands can have a ring structure. At least one heteroatom can also be contained in this ring structure. This at least one heteroatom can be preferably nitrogen or oxygen.

The organic ligands can also comprise aromatic ligands.

As ionic ligands, alkyl ligands, preferably unbranched alkyl ligands, as for example methyl ligands, or cyclopentadienyl are preferred.

As the unsaturated organic ligands, alkenes, conjugated or non-conjugated dienes and allyls can be preferred. According to the invention, as the organic groups, π-allyl and aromatic transition metal complexes can also be provided.

The carbonyl complexes used according to the invention can contain one or more metal atoms. If the carbonyl complexes have several metal atoms, then these metal atoms can be of the same or different type.

As the metals of the carbonyl complexes, preferably metals are used that have a high affinity to oxygen.

Preferably, the carbonyl complexes have at least one element of the transition elements, that is, elements of the 3rd to 11th group of the periodic table of elements.

According to the invention, it can be further preferred that the at least one metal of the metal carbonyls used according to the invention is a metal selected from the group comprising vanadium, molybdenum, tungsten, manganese, iron, ruthenium, osmium, cobalt, and nickel.

According to one especially preferred embodiment, the carbonyl complexes comprise metal carbonyls.

In the scope of the invention, the term "metal carbonyls" should describe compounds that represent mononuclear or polynuclear coordination compounds, in which exclusively carbon monoxide molecules are coordinately bound to metal atoms, According to the invention, metal carbonyls can contain one metal atom or multiple metal atoms.

The metal atoms contained in the metal carbonyls can be of the same or different type.

Preferably, the metal atoms of the metal carbonyls comprise elements of the transition metals, that is, elements of the 3rd to 11th group of the periodic table of elements.

According to a preferred embodiment, the at least one metal of the metal carbonyls used according to the invention comprises a metal selected from the group comprising vanadium, molybdenum, tungsten, manganese, iron, ruthenium, osmium, cobalt, and nickel.

The metal carbonyl can exist charge neutral or as a salt. The salt can comprise a monovalent or polyvalent salt.

According to one especially preferred embodiment, the metal complex used as the sintering agent according to the invention is a metal complex selected from the group comprising vanadium hexacarbonyl ($V(CO)_6$), molybdenum hexacarbonyl ($Mo(CO)_6$), tungsten hexacarbonyl ($W(CO)_6$), dimanganese decacarbonyl ($Mn_2(CO)_{10}$), methylcyclopentadienyl manganese tricarbonyl (($CH_3C_5H_4)Mn(CO)_3$), iron pentacarbonyl ($Fe(CO)_5$), diiron nonacarbonyl ($Fe_2(CO)_9$), triiron dodecacarbonyl ($Fe_3(CO)_{12}$), diprototetracarbonylferrate(II) ($H_2[Fe(CO)_4]$), dicarbonyl diiodine iron ($Fe(CO)_2I_2$), tripotassium carbonylpentacyanoferrate ($K_3[Fe(CN)_5CO]$), 1,2-Bis-(hexamethylbenzol)-tetracarbonyldiiron (0) ($C_{12}H_{18}Fe(CO)_4FeC_{12}H_{18}$), carbidopentairon pentadecacarbonyl ($Fe_5C(CO)_{15}$), ruthenium pentacarbonyl ($Ru(CO)_5$), diruthenium nonacarbonyl ($Ru_2(CO)_9$), triruthenium dodecacarbonyl ($Ru_3(CO)_{12}$), hexaruthenium hexadecacarbonyl ($Ru_6(CO)_{16}$), osmium pentacarbonyl ($Os(CO)_5$), triosmium dodecacarbonyl ($Os_3(CO)_{12}$), pentaosmium hexadecacarbonyl ($Os_5(CO)_{16}$), hexaosmium octadecacarbonyl ($Os_6(CO)_{18}$), dicobalt octacarbonyl ($Co_2(CO)_8$), tetracobalt dodecacarbonyl ($Co_4(CO)_{12}$), hexacobalt hexadecacarbonyl ($Co_6(CO)_{16}$), nickel tetracarbonyl ($Ni(CO)_4$), and disodium carbonylferrate ($Na_2[Fe(CO)_4]$).

The sintering agents according to the invention are preferably used as a component of a metal paste that is used in a sintering process. Preferably, in this sintering process, components are connected to each other that are in contact with each other via the metal paste in a sandwich arrangement.

The metal pastes used according to the invention can also have other substances in addition to metals, metal precursors, solvents, and sintering agents.

These other substances can preferably comprise substances typically used in metal pastes.

For example, as the other substances, dispersants, surfactants, anti-foaming agents, binding agents, polymers, or viscosity-controlling agents can be contained in the metal paste.

The metal paste according to the invention contains 75-90 weight percent, preferably 77-89 weight percent, more preferably 78-87 weight percent, and even more preferably 78-86 weight percent of at least one of the metals described herein and present in the form of particles. These weight specifications include the weight of the coating compounds contained on the particles.

The metal paste according to the invention contains 0-12 weight percent, preferably 0.1-12 weight percent, more preferably 1-10 weight percent, and even more preferably 2-8 weight percent of at least one metal precursor.

The metal paste according to the invention contains 6-20 weight percent, preferably 7-18 weight percent, more preferably 8-17 weight percent, and even more preferably 10-15 weight percent of at least one solvent.

The metal paste according to the invention contains 0.1-15 weight percent, preferably 0.1-12 weight percent, more preferably 1-10 weight percent, and even more preferably 1-8 weight percent of at least one of the sintering agents described herein.

The metal paste according to the invention contains 0-15 weight percent, preferably 0-12 weight percent, more preferably 0.1-10 weight percent, and even more preferably 1-10 weight percent of other substances.

Consequently, the metal paste according to the invention contains 75-90 weight percent of at least one of the metals described herein, 0-12 weight percent of at least one metal precursor, 6-20 weight percent of at least one solvent, and 0.1-15 weight percent of at least one of the sintering agents described herein.

According to one preferred embodiment, the metal paste according to the invention contains 77-89 weight percent of at least one of the metals described herein, 0.1-12 weight percent of at least one metal precursor, 7-18 weight percent of at least one solvent, and 0.1-12 weight percent of at least one of the sintering agents described herein.

According to a more preferred embodiment, the metal paste according to the invention contains 78-87 weight percent of at least one of the metals described herein, 0.1-10 weight percent of at least one metal precursor, 8-17 weight percent of at least one solvent, and 1-10 weight percent of at least one of the sintering agents described herein.

According to an even more preferred embodiment, the metal paste according to the invention contains 78-86 weight percent of at least one of the metals described herein, 2-8 weight percent of at least one metal precursor, 10-15 weight percent of at least one solvent, and 1-8 weight percent of at least one of the sintering agents described herein.

According to an especially preferred embodiment, the molar ratio of sintering agents to organic compounds (coating compounds) contained in the coating of the metal particles lies in the range from 1:1 to 150:1, more preferably in the range from 3:1 to 100:1, even more preferably in the range from 5:1 to 80:1, and especially in the range from 10:1 to 80:1. The molar ratio of sintering agents to coating compounds according to the invention is designated as the quotient of (i) the sum of quantities of materials of the sintering agents contained in the metal paste and (ii) the sum of quantities of materials of the coating compounds contained in the coating of the metal particles. If a metal paste contains, e.g., as a sintering agent 0.025 mol aluminum formate and 0.015 mol copper formate and as the sole coating compound 0.0008 mol potassium stearate, then the molar ratio of sintering agents to coating compounds equals 50:1.

A ratio of sintering agents to coating compounds in the preferred range according to the invention produces other advantageous effects. On one hand, it is ensured that sufficient carbon monoxide is available for reducing the metal oxides during the sintering process as a result of the combustion of the coating compounds. On the other hand, the quantity of sintering agents is then still not high enough to negatively affect the sintering process. As explained above, it can be preferred according to the invention if the organic compounds contained in the coating of the metal particles comprise free fatty acids, fatty acid salts, or fatty acid esters preferably having 8-24, more preferably 10-24, and even more preferably 12-18 carbon atoms.

If free fatty acids, fatty acid salts, or fatty acid esters having preferably 8-24, more preferably 10-24, and even more preferably 12-18 carbon atoms are contained in the metal paste, not only as coating compounds but also as other substances in the metal paste, then it can be preferred that, for the definition of the molar ratio of sintering agents to coating compounds, the term coating compounds comprises, in addition to the fatty acids, fatty acid salts, or fatty acid esters contained on the surface of the metal particles, also the fatty acids, fatty acid salts, or fatty acid esters contained as additional substances in the metal paste.

According to the invention, insofar as compounds represent both sintering agents and also metal precursors, then for determining the weight percentages and the molar ratios of sintering agents to coating compounds, these compounds are preferably considered to be sintering agents.

Preferably, however, the sintering agents and the metal precursors comprise compounds that differ from each other.

The metal pastes described herein are used according to the invention in a sintering process.

Preferably, sintering is understood to be the joining of two or more components by heating while bypassing the liquid phase.

According to the invention, the joining of at least two components is understood to be the fixing of a first component on a second component. In this context "on" merely means that a surface of the first component is connected to a surface of the second component, wherein this condition does not depend on the relative position of the two components or of the arrangement that contains the at least two components.

In the scope of the invention, the term component should preferably comprise individual parts. These individual parts preferably cannot be further dismantled.

According to special embodiments, parts designated as the components are those used in high-power electronics.

Accordingly, the components can comprise, for example, diodes, LEDs (light emitting diodes), DCB (direct copper bonded) substrates, leadframes, dies, IGBTs (insulated-gate bipolar transistors), ICs (integrated circuits), sensors, heat sinks (preferably aluminum heat sinks or copper heat sinks), or other passive components (for example resistors, capacitors, or inductors). Preferably, the components can also comprise non-metallic components.

The components to be connected can be the same or different components.

In preferred embodiments, the invention relates to the joining of LEDs to leadframes, of LEDs to ceramic substrates, of dies, diodes, IGBTs, or ICs to leadframes, ceramic substrates or DCB substrates, of sensors to leadframes or ceramic substrates, of DCB or ceramic substrates to copper or aluminum heat sinks, of leadframes to heat sinks, or of tantalum capacitors, preferably in a non-housed state, to leadframes.

In a similarly preferred way, more than two components can be joined to each other. For example, (i) LED or chip can be joined to (ii) leadframes and (iii) heat sinks, wherein the leadframes are preferably located between (i) the LED or chip and (iii) heat sinks Likewise, a diode can be joined to two heat sinks, wherein the diode is preferably located between the two heat sinks According to a preferred embodiment, the components can comprise at least one metallization layer. This metallization layer is preferably part of the component. The metallization layer is preferably located on at least one surface of the component.

The metallization layer can have pure metal. For example, it can be preferred if the metallization layer has at least 50 weight percent, more preferably at least 70 weight percent, even more preferably at least 90 weight percent, or even 100 weight percent of pure metal. The pure metal is preferably selected from the group comprising copper, silver, gold, palladium, and platinum.

On the other hand, the metallization layer can also have an alloy. The alloy of the metallization layer preferably contains at least one metal selected from the group comprising silver, gold, nickel, palladium, and platinum. It can also be preferred that at least two metals selected from the group comprising silver, gold, nickel, palladium, and platinum are contained in the alloy of the metallization layer.

The proportion of elements selected from the group comprising silver, gold, nickel, palladium, and platinum to the alloy preferably equals at least 90 weight percent, more preferably at least 95 weight percent, even more preferably at least 99 weight percent, thus for example 100 weight percent.

According to a preferred embodiment, the metallization layer preferably contains at least 95 weight percent, more preferably at least 99 weight percent, and even more preferably 100 weight percent of this alloy.

The metallization layer can also have a multi-layer structure. For example, it can be preferred if at least one surface of the components to be assembled includes a metallization layer made of several layers having the previously mentioned pure metals and/or alloys.

According to a preferred embodiment, at least one metallization layer of a component, in particular a DCB substrate, comprises a layer made of copper on which a layer made of nickel is deposited. Optionally, a gold layer can also be deposited on the nickel layer. In this case, the thickness of the nickel layer preferably equals 1-2 μm and the thickness of the gold layer preferably equals 0.05-0.3 μm. On the other hand, it can be preferred if a metallization layer of a component comprises a silver or gold layer and above this a palladium or platinum layer.

According to another preferred embodiment, the individual layers also contain a glass in addition to the mentioned pure metals or alloys. It can also be preferred if the layers are a mixture made of (i) glass and (ii) the pure metals or alloys.

According to the invention, at least two components are joined to each other by sintering.

For this purpose, initially the at least two components are brought into contact with each other. The contacting is here realized by the metal paste according to the invention. For this purpose, an arrangement is provided in which metal paste is located between every two components of the at least two components.

Therefore, if two components, component 1 and component 2, are to be joined to each other, then the metal paste according to the invention is located between component 1 and component 2 before sintering. On the other hand, it is conceivable that more than two components are joined to each other. For example, three components, component 1, component 2, and component 3, can be joined to each other such that component 2 lies between component 1 and component 3. In this case, the metal paste according to the invention is located both between component 1 and component 2 and also between component 2 and component 3.

According to the invention, it is provided that the individual components are present in a sandwich arrangement and are joined to each other.

According to the invention, a sandwich arrangement is understood to be an arrangement in which two components are located one above the other and the components are essentially parallel to each other.

The arrangement made of at least two components and metal paste, with the metal paste being located between the two components of this arrangement, can be manufactured according to a method known from the prior art.

Preferably, at least one surface of a component 1 is provided with the metal paste according to the invention. Then a different component 2 is placed with one of its surfaces on the metal paste that has been deposited on the surface of component 1.

The deposition of the metal paste on the surface of a component can be performed by conventional methods. Preferably the deposition of the metal paste is performed by a printing method, for example by screen printing or stencil printing. On the other hand, the deposition of the metal paste can also be performed by a dispensing technique, by a spraying technique, by pin transfer, or by dipping.

After the deposition of the metal paste, the surface of this component provided with the metal paste is preferably brought into contact with a surface of the component to be joined via the metal paste. In this way, a layer of metal paste is located between the components to be joined.

The wet layer thickness between the components to be joined preferably lies in the range of 20-200 μm. The wet layer thickness is understood, according to the invention, to be the distance between the opposing surfaces of the components to be joined before the sintering process. The preferred wet layer thickness is dependent on the selected method for the deposition of the metal paste. If the metal paste is deposited, for example, by a screen printing method, then a wet layer thickness of 20-50 μm can be preferred. If the metal paste is deposited by stencil printing, then the preferred wet layer thickness can lie in the range of 50-200 μm.

According to a preferred embodiment, a drying step is performed before the sintering process.

Preferably, drying is understood to be a reduction of the proportion of solvent in the metal paste.

According to one preferred embodiment, the proportion of solvent in the metal paste after the drying is in the range of 1-5 weight percent, based on the weight of the dried metal paste.

The drying can be performed, on one hand, after the production of the arrangement, that is, after the contacting of the components to be joined. On the other hand, the drying can also be performed directly after the deposition of the metal paste on the at least one surface of the component and before the contacting with the component to be joined.

The drying temperature preferably lies in the range of 50-100° C.

It is understood that the drying time is dependent on the composition of the respective metal paste and the size of the arrangement to be sintered. Typical drying times lie in the range of 5-45 minutes.

The arrangement made of the at least two components and metal paste located between the components is finally subjected, according to the invention, to a sintering process.

This sintering process comprises a low-temperature sintering process.

According to the invention, a low-temperature sintering process is understood to be a sintering process that preferably takes place at a temperature of less than 200° C.

The processing pressure here is preferably less than 30 MPa, more preferably less than 5 MPa, and even more preferably less than 1 MPa. Due to the use of the metal paste according to the invention, sintering is even possible without any application of processing pressure, thus at a processing pressure of 0 MPa.

The sintering time is dependent on the processing pressure and preferably lies in the range of 2-45 minutes.

According to the invention, the sintering process can take place in an atmosphere that is not further limited. Preferably, however, the sintering is performed in an atmosphere that contains oxygen.

The sintering is performed in a conventional device that is suitable for sintering and in which preferably the previously described processing parameters can be set.

The invention is explained below with reference to the examples listed below, but are not to be understood as limiting.

EXAMPLES

1. Production of Metal Pastes:

Initially, the metal pastes 1-7 according to the invention and the comparison pastes 1 and 2 were produced by mixing the individual components.

1.1 Metal Paste 1 According to the Invention:

A metal paste was produced containing 81.5 weight percent coated silver particles having an average particle diameter of 1-5 μm (coating quantity: <2 weight percent sodium stearate), 5 weight percent silver carbonate, 6 weight percent terpineol, 4 weight percent 1-dodecanol, and 3.5 weight percent aluminum formate.

1.2 Metal Paste 2 According to the Invention:

A metal paste was produced containing 79.5 weight percent coated silver particles having an average particle diameter of 0.5-3 μm (coating quantity: <2 weight percent sodium stearate), 3 weight percent silver oxide, 10.5 weight percent terpineol, and 7 weight percent aluminum formate.

1.3 Metal Paste 3 According to the Invention:

A metal paste was produced containing 80.5 weight percent coated silver particles having an average particle diameter of 2-15 μm (coating quantity: <2 weight percent sodium stearate), 3.5 weight percent silver carbonate, 5 weight percent copper (II) formate, 6 weight percent terpineol, and 5 weight percent 1-hexanol.

1.4 Metal Paste 4 According to the Invention:

A metal paste was produced containing 81 weight percent coated silver particles having an average particle diameter of 0.5-5 μm (coating quantity: <2 weight percent sodium stearate), 4.3 weight percent silver oxide, 3.5 weight percent manganese(III) formate, 6 weight percent 1-hexanol, and 5.2 weight percent 1-dodecanol.

1.5 Metal Paste 5 According to the Invention:

A metal paste was produced containing 76.4 weight percent coated silver particles having an average particle diameter of 0.5-5 μm (coating quantity: <2 weight percent sodium stearate), 4.3 weight percent silver oxide, 2 weight percent silver carbonate, 6 weight percent aluminum formate, 6.3 weight percent tridecanol, and 5 weight percent 1-isotridecanol.

1.6 Metal Paste 6 According to the Invention:

A metal paste was produced containing 76.4 weight percent coated silver particles having an average particle diameter of 0.5-5 μm (coating quantity: <2 weight percent sodium stearate), 4.3 weight percent silver oxide, 2 weight percent silver carbonate, 4 weight percent aluminum formate, 2 weight percent copper (II) formate, 6.3 weight percent tridecanol, and 5 weight percent 1-isotridecanol.

1.7 Metal Paste 7 According to the Invention:

A metal paste was produced containing 79.7 weight percent coated silver particles having an average particle diameter of 0.5-5 μm (coating quantity: <2 weight percent sodium stearate), 2 weight percent silver carbonate, 4 weight percent aluminum formate, 2 weight percent copper(II) formate, 6.3 weight percent tridecanol, and 6 weight percent terpineol.

1.8 Comparison Paste 1:

A metal paste was produced containing 79.5 weight percent coated silver particles having an average particle diameter of 0.5-3 μm (coating quantity: <2 weight percent sodium stearate), 3 weight percent silver oxide, 10.5 weight percent terpineol, and 7 weight percent formic acid. The comparison paste 1 thus corresponds to the metal paste 2 according to the invention with the deviation that the aluminum salt of formic acid, aluminum formate, is replaced by formic acid.

1.9 Comparison Paste 2:

A metal paste was produced containing 83 weight percent coated silver particles having an average particle diameter of 0.5-3 μm (coating quantity: <2 weight percent sodium stearate), 6.5 weight percent silver oxide, 10.5 weight percent terpineol, and 7 weight percent formic acid. The comparison paste 2 thus corresponds to the metal paste 2 according to the invention, with the deviation that it does not contain aluminum formate, but instead the proportion of silver particles and silver oxide is increased.

2. Embodiments

The produced metal pastes were used for sintering two components to be joined to each other.

2.1 Embodiment 1

In this example, DCB substrates, each of which has a metallization layer made of silver, and IGBTs, each of which likewise has a metallization layer made of silver, are joined to each other by sintering.

For this purpose, the metal pastes 1-7 according to the invention or the comparison pastes 1 and 2 were deposited on the metallization layer of the individual DCB substrates by a screen printing method. Then the individual IGBTs with the metallization layer were placed on the pastes.

In the cases in which the metal pastes 1 and 4-6 according to the invention were used, a drying of the structure made of the DCB substrate, metal paste, and IGBT was performed at 80° C. for 20 minutes. In the other cases, drying was not required. In each case, the wet layer thickness equaled 100 µm.

The structure produced in this way was sintered for 20 seconds at a processing pressure of 5 MPa and at different processing temperatures.

2.2 Embodiment 2

This embodiment corresponds to Embodiment 1 with the deviation that the resulting structure was sintered for 15 minutes in a pressure-free environment.

2.3 Embodiment 3

In this example, leadframes, each of which has a metallization layer consisting of a nickel layer and a gold layer, with the gold layer being located on the outer side, and diodes, each of which contained a metallization layer made of silver, were joined to each other by sintering.

For this purpose, the metal pastes 1-7 according to the invention or the comparison pastes 1 and 2 were deposited on the metallization layer of the individual leadframes by a stencil printing method. Then the individual diodes having the metallization layer were placed on the pastes.

In the cases in which the metal pastes 1 and 4-6 according to the invention were used, drying of the structure made of the DCB substrate, metal paste, and IGBT was performed at 80° C. for 20 minutes. In the other cases, drying was not required. In each case, the wet layer thickness equaled 100 µm.

The structure produced in this way was sintered for 20 seconds at a processing temperature of 5 MPa and at different processing temperatures.

2.4 Embodiment 4

This embodiment corresponds to embodiment 3 with the deviation that the resulting structure was sintered for 15 minutes in a pressure-free environment.

Results:

3.1 Embodiments 1 and 3

In the embodiments in which the metal pastes 1-7 according to the invention were used, the sintering temperature was approximately 195° C. in each case. In contrast, the sintering temperature in the embodiments in which the comparison pastes 1 and 2 were used was approximately 230° C. in each case.

3.2 Embodiments 2 and 4

In the embodiments in which the metal pastes 1-7 according to the invention were used, the sintering temperature was approximately 185° C. in each case. In contrast, the sintering temperature in the embodiments in which the comparison pastes 1 and 2 were used was approximately 230° C. in each case.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A metal paste containing:
   (A) 75-90 weight percent of at least one metal present in a form of particles having a coating containing at least one organic compound;
   (B) 0.1-12 weight percent of at least one metal precursor selected from the group consisting of silver carbonate, silver(I) oxide and silver(II) oxide;
   (C) 6-20 weight percent of at least one solvent; and
   (D) 0.1-15 weight percent of at least one sintering agent selected from the group consisting of:
       (i) salts of organic acids selected from the group consisting of aluminum formate, iron(II) acetate, iron(II) carbonate, iron(II) formate, tin(II) formate, magnesium formate, manganese(III) formate, and cobalt(II) oxalate,
       (ii) esters of organic acids, wherein the organic acids have 1-4 carbon atoms, and
       (iii) carbonyl complexes.

2. The metal paste according to claim 1, wherein the at least one sintering agent is selected from esters of the group comprising methyl formate, ethyl formate, propyl formate, and butyl formate.

3. The metal paste according to claim 1, wherein the at least one sintering agent is selected from carbonyl complexes of the group comprising metal carbonyls.

4. The metal paste according to claim 3, wherein the metal carbonyl is an iron carbonyl.

5. The metal paste according to claim 1, wherein the at least one organic compound is selected from the group comprising free fatty acids, fatty acid salts, and fatty acid esters, each of which has 8-24 carbon atoms.

6. The metal paste according to one of claim 1, wherein a molar ratio of the at least one sintering agent to the at least one organic compound contained in the coating lies in a range of 1:1 to 150:1.

7. A method for joining at least two components, the method comprising:
   (a) providing a sandwich arrangement having at least:
       (a1) a first component,
       (a2) a second component, and
       (a3) a metal paste located between the first component and the second component; and
   (b) sintering the sandwich arrangement, wherein the metal paste comprises:
       (A) 75-90 weight percent of at least one metal present in a form of particles having a coating containing at least one organic compound,
       (B) 0.1-12 weight percent of at least one metal precursor;
       (C) 6-20 weight percent of at least one solvent; and
       (D) 0.1-15 weight percent of at least one sintering agent selected from the group consisting of:
           (i) salts of organic acids, selected from the group consisting of aluminum formate, iron(II) acetate, iron(II) carbonate, iron(II) formate, tin(II) formate, magnesium formate, manganese(III) formate, and cobalt(II) oxalate,
           (ii) esters of organic acids, wherein the organic acids have 1-4 carbon atoms, and
           (iii) carbonyl complexes.

8. The method according to claim 7, wherein the sintering takes place at a temperature of less than 200° C.

9. The method according to claim 7, wherein each of the first and second components comprises at least one metallization layer.

10. A sintering paste consisting essentially of:
    (A) 75-90 weight percent of silver particles having a coating containing at least one organic compound;
    (B) 0.1-12 weight percent of at least one metal precursor selected from the group consisting of silver carbonate, silver(I) oxide and silver(II) oxide;
    (C) 6-20 weight percent of at least one solvent; and
    (D) 0.1-15 weight percent of at least one sintering agent consisting of aluminum

* * * * *